United States Patent [19]
Lee

[11] Patent Number: 5,739,720
[45] Date of Patent: Apr. 14, 1998

[54] SWITCHED CAPACITOR OFFSET SUPPRESSION

[75] Inventor: Wai L. Lee, Wilmington, Mass.

[73] Assignee: Analog Devices, Inc., Norwood, Mass.

[21] Appl. No.: 815,336

[22] Filed: Mar. 11, 1997

Related U.S. Application Data

[63] Continuation of Ser. No. 447,874, May 23, 1995, abandoned.

[51] Int. Cl.$^6$ ...................................................... H03F 1/14
[52] U.S. Cl. ........................................... 330/9; 330/51
[58] Field of Search .................................. 330/9, 51, 107; 327/554

[56] References Cited

U.S. PATENT DOCUMENTS

| | | | |
|---|---|---|---|
| 3,988,689 | 10/1976 | Ochi et al. | 330/9 |
| 4,138,649 | 2/1979 | Schaffer | 330/9 |
| 4,400,637 | 8/1983 | Klar et al. | 307/497 |
| 4,574,250 | 3/1986 | Senderowicz | 330/258 |
| 4,633,223 | 12/1986 | Senderowicz | 330/9 X |
| 5,134,401 | 7/1992 | McCartney et al. | 341/143 |
| 5,159,341 | 10/1992 | McCartney et al. | 341/143 |
| 5,311,181 | 5/1994 | Ferguson, Jr. et al. | 341/143 |
| 5,334,944 | 8/1994 | Hirakata | 330/9 X |
| 5,381,148 | 1/1995 | Mueck et al. | 341/139 |
| 5,410,270 | 4/1995 | Rybicki | 330/9 |

FOREIGN PATENT DOCUMENTS

| | | |
|---|---|---|
| 0039076 | 4/1981 | European Pat. Off. |
| 0379240 | 1/1990 | European Pat. Off. |

OTHER PUBLICATIONS

D.B. Ribner, R.D. Baertsch, S.L. Garverick, D.T. McGrath, J.E. Krisciunas, and T.Fuji, "A Third–Order Multistage Sigma–Delta Modulator With Reduced Sensitivity to Non-idealities," *IEEE Journal of Solid–State Circuits*, vol. 26, No. 12, pp. 1764–1773, Dec. 1991.

K. Nagarai, K. Singhal, T.R. Viswanathan, and J. Vlach, J.; "Reduction of Finite-gain Effect in Switched–capacitor Filters," *Electronics Letters*, vol. 21, No. 15, pp. 644–645, Jul. 18th, 1985.

Paul R. Gray and Robert G. Meyer "Analysis and Design of Analog Integrated" (1977, 1984), pp. 737–741.

*Primary Examiner*—Steven Mottola
*Attorney, Agent, or Firm*—Wolf, Greenfield & Sacks, P.C.

[57] ABSTRACT

A switched-capacitor circuit that includes a first signal path disposed between a first input node and a first output node, and a second signal path disposed between a second input node and a second output node. The first and second switches can be alternately disposed within the first and second signal paths. An amplifier responsive to the switches can be provided, and its offset can be cancelled. The outputs of the amplifiers can be maintained, and this can involve buffering.

22 Claims, 8 Drawing Sheets

SWITCHED CAPACITOR OFFSET SUPPRESSION

This application is a continuation of application Ser. No. 08/447,874, filed May 23, 1995 and now abandoned.

This application is related to two commonly assigned applications respectively entitled "DATA ACQUISITION SYSTEM" to Wai Lee Ser. No. 08/447,735 and "MULTI-RATE IIR DECIMATION AND INTERPOLATION FILTERS," to Wai Lee and Tom Kwan Ser. No. 08/447,156, both filed on May 23, 1995 and herein incorporated by reference.

FIELD OF THE INVENTION

The present invention relates to switched-capacitor circuits and more particularly to differential switched-capacitor circuits with reduced offset voltage effects from mismatch in switch charge injections.

BACKGROUND OF THE INVENTION

Resistor structures on a CMOS integrated circuit, especially when their resistance value is high, can occupy large areas. By substituting capacitors and switches for these resistors, switched-capacitor circuits can perform the same function as equivalent analog circuits that contain only non-switched capacitors and resistors. Such switched-capacitor circuits generally occupy less area than their analog counterparts.

Figure 1:
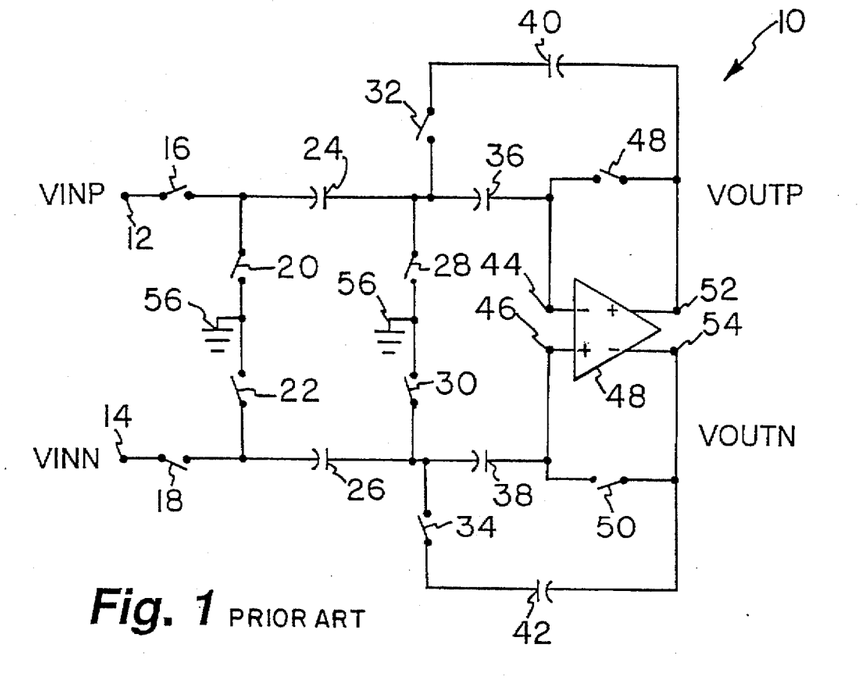
FIG. 1 is a schematic circuit diagram of a prior art switched-capacitor circuit.
Figure 2:
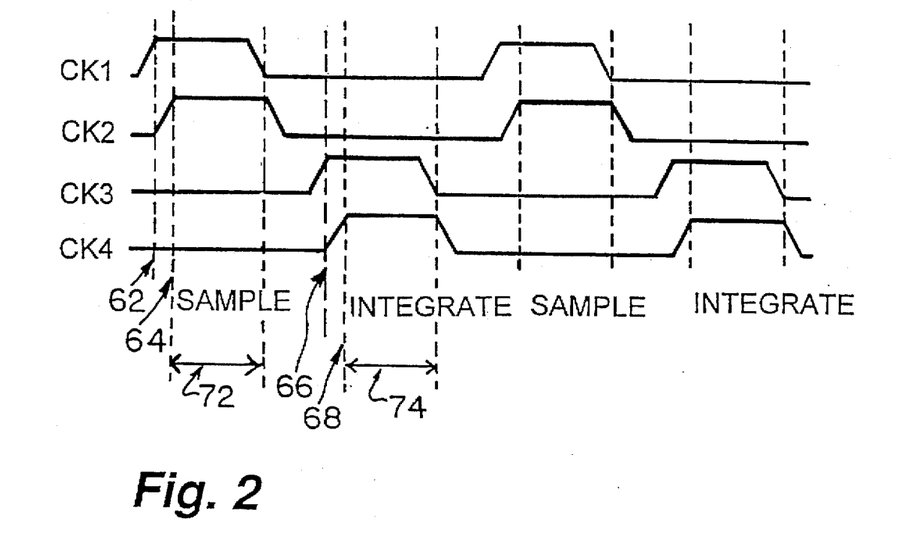
FIG. 2 is a timing diagram illustrating clock signals that drive switches in the circuit of FIG. 1.

FIG. 1 shows a schematic circuit diagram of a typical prior art switched-capacitor integrator circuit 10 implemented using a conventional CMOS process, and FIG. 2 shows clock signals that drive the switches of this circuit. This circuit periodically samples and integrates a first input VINP at a first input terminal 12 and a second input VINN at a second input terminal 14.

More particularly, during a sampling interval 72, the first and second input switches 16, 18, and the first and second cancelling grounding switches 28, 30 are closed, allowing the first input VINP and the second input VINN to be sampled respectively in the first and second sampling capacitors 24, 26. At the end of the sampling interval, these switches are then opened, which isolates the sampling capacitors from the inputs. An integrating interval follows, during which the first and second input grounding switches 20, 22 and the first and second integrate switches 32, 34 are closed, causing charge from the sampling capacitors to be transferred to their respective integrating capacitors 42. When the sampling and integrating intervals are repeated continuously in this way, the switched-capacitor circuit acts like an analog integrator circuit, providing a differential output signal which is an approximate integral of the differential input signal. Switched-capacitor integrator circuits are discussed in more detail in *Analysis and Design of Analog Integrated Circuits*, by Paul R. Gray and Robert G. Meyer, John Wiley & Sons, Inc. 1984, pp. 737–741.

An input offset of the amplifier 48 in the switched capacitor circuit 10 can contribute an offset error to the output signal, but the offset capacitors 36, 38 cancel out this error. In particular, during the sampling interval 72, the first and second offset capacitors each store a charge corresponding to the offset voltage contributions from respectively the first and second amplifier inputs 44, 46. Then, during the integrating interval 74, the first and second offset capacitors are connected in series with respectively the first and second amplifier inputs, and the stored charge on these offset capacitors cancels the offset voltage contribution from the amplifier inputs.

The switches can also contribute to the circuit's offset error. The timing of the clock signals shown in FIG. 2 can reduce these errors, however, by providing that the signal on terminal CK2 be delayed from that on CK1 during the sampling interval 72, and that the signal on CK4 be delayed from that on CK3 during the integrating interval 74.

During the sampling interval, the earlier signal CK1 drives the first cancelling grounding switch 28, the second cancelling grounding switch 30, the first amplifier offset switch 48, and the second amplifier offset switch 50. These switches are called "quick switches," because they open before the "non-quick switches." The non-quick switches include the first input switch 16 and the second input switch 18, and these switches are driven by the later signal, CK2.

With the quick switches already open when the non-quick switches open, the circuit path from the non-quick switches to ground is broken at the end of the sampling interval. This can prevent charge injection from the non-quick switches from being stored in the circuit when they open. During the integrating interval a similar effect is achieved, with the first integrate switch 32 and the second integrate switch 34 being quick switches that are driven by CK3, and the first input grounding switch 20 and the second input grounding switch 22 being non-quick switches that are driven by CK4.

Figure 3:
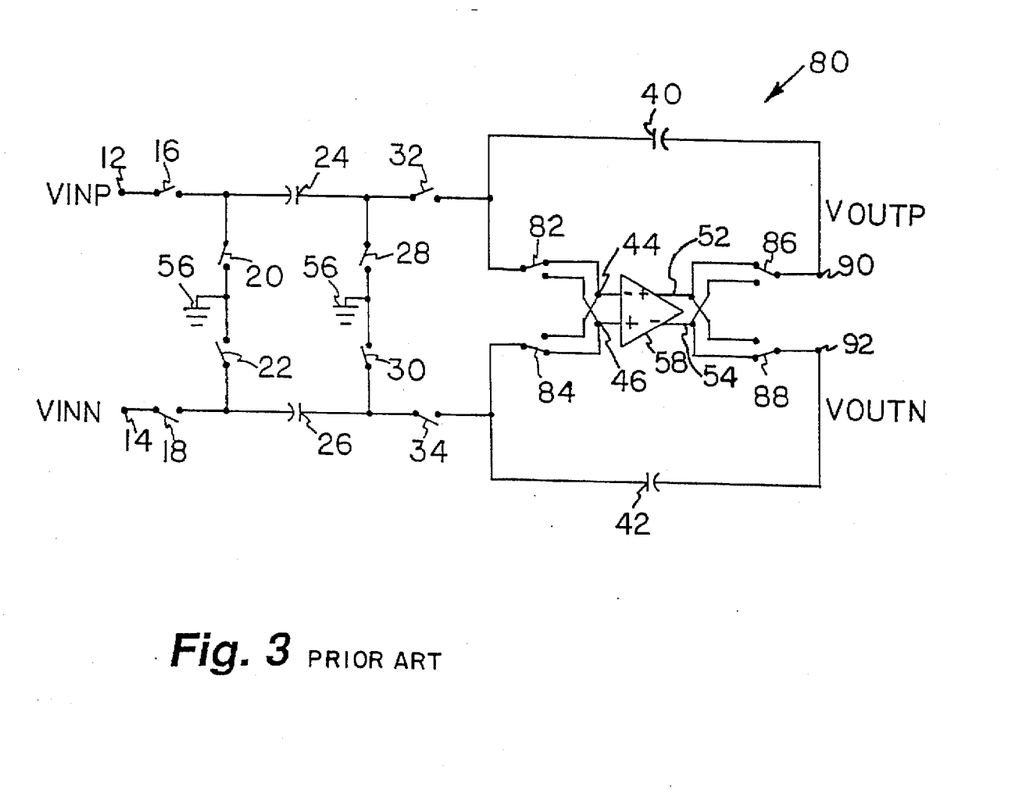
FIG. 3 is a schematic circuit diagram of an alternative prior art switched-capacitor circuit, which includes amplifier terminal chopping.

FIG. 3 shows a schematic circuit diagram of an alternative prior art switched-capacitor circuit 80 that can suppress the offset voltage contribution from an amplifier in a different way. This circuit also samples and integrates, but it differs from circuit 10 of FIG. 1 in that it includes four chopping switches 82, 84, 86, and 88, instead of the offset cancelling capacitors in circuit 10. These chopping switches cause the two halves of the differential amplifier 48 to alternate between serving in a top signal path and in a bottom signal path. Thus, the input offset voltage contribution from the amplifier 48 can be distributed evenly between the two signal paths.

SUMMARY OF THE INVENTION

In one general aspect, the invention features a switched-capacitor circuit that includes a first signal path disposed between a first input node and a first output node, a second signal path disposed between a second input node and a second output node, and means for alternately disposing a first switch within the first and second signal paths and a second switch within the first and second signal paths. The circuit can include an amplifier responsive to the switches, and means can be provided to cancel the amplifier input offset. Means can also be provided to maintain the outputs of the amplifier, and these can include buffering means.

In another general aspect, the invention features operating a switched-capacitor circuit by switching a first signal to charge a first capacitor in a first signal path with a first switch, switching a second signal to charge a second capacitor in a second signal path with a second switch, switching the first signal to charge the first capacitor in the first signal path with the second switch, and switching the second signal to charge the second capacitor in the second signal path with the first switch. These steps can be repeated in different types of sequences.

In a further general aspect, the invention features a switched-capacitor circuit that includes a first switch with a first circuit path provided between it and a first output node, and a second switch with a second circuit path provided between it and a second output node. A first demultiplexer has an input operatively connected to a first input node, a first output operatively connected to the first switch, and an output operatively connected to the second switch. A second demultiplexer has an input operatively connected to the second input node, a third output operatively connected to the second switch, and a fourth output operatively connected to the first switch.

The circuit can also include two multiplexers. The first multiplexer is disposed within the first circuit path with a first input operatively connected to the first switch, a second input operatively connected to the second switch, and an output operatively connected to the first output node. The second multiplexer is disposed within the second circuit path with a third input operatively connected to the second switch, a fourth input operatively connected to the first switch, and a second output operatively connected to the second output node. A first control driving circuit can have a control terminal operatively connected to control inputs of the switches, a second control driving circuit can have a first control terminal operatively connected to control inputs of the demultiplexers, and a second control terminal operatively connected to control inputs of the multiplexers.

The switched-capacitor circuit can be a sampling and integrating circuit, with the switches being integrate switches, and with sampling capacitors being operatively connected to the input nodes. A third circuit path can be provided between a first input of a third multiplexer and the first switch, and a fourth circuit path can be provided between a second input of the third multiplexer and the second switch. A fifth circuit path can be provided between a first input of a fourth multiplexer and the second switch, and a sixth circuit path can be provided between the second input of the fourth multiplexer and the first switch. The outputs of the third and fourth multiplexers can be respectively operatively connected to first and second amplifier inputs, and their control inputs can be operatively connected to the second control terminal. A first integrating capacitor can be operatively connected between the first multiplexer output and the first amplifier output, and a second integrating capacitor can be operatively connected between the second multiplexer output and the second amplifier output.

Offset cancelling capacitors can be disposed in the third and fourth circuit paths. Output maintenance capacitors can be provided, each having a plate operatively connected to an amplifier output. Another plate of each capacitor can be operatively connected to a maintenance grounding switch. Buffers can be provided within the fifth and sixth circuit paths.

DETAILED DESCRIPTION

Figure 4:
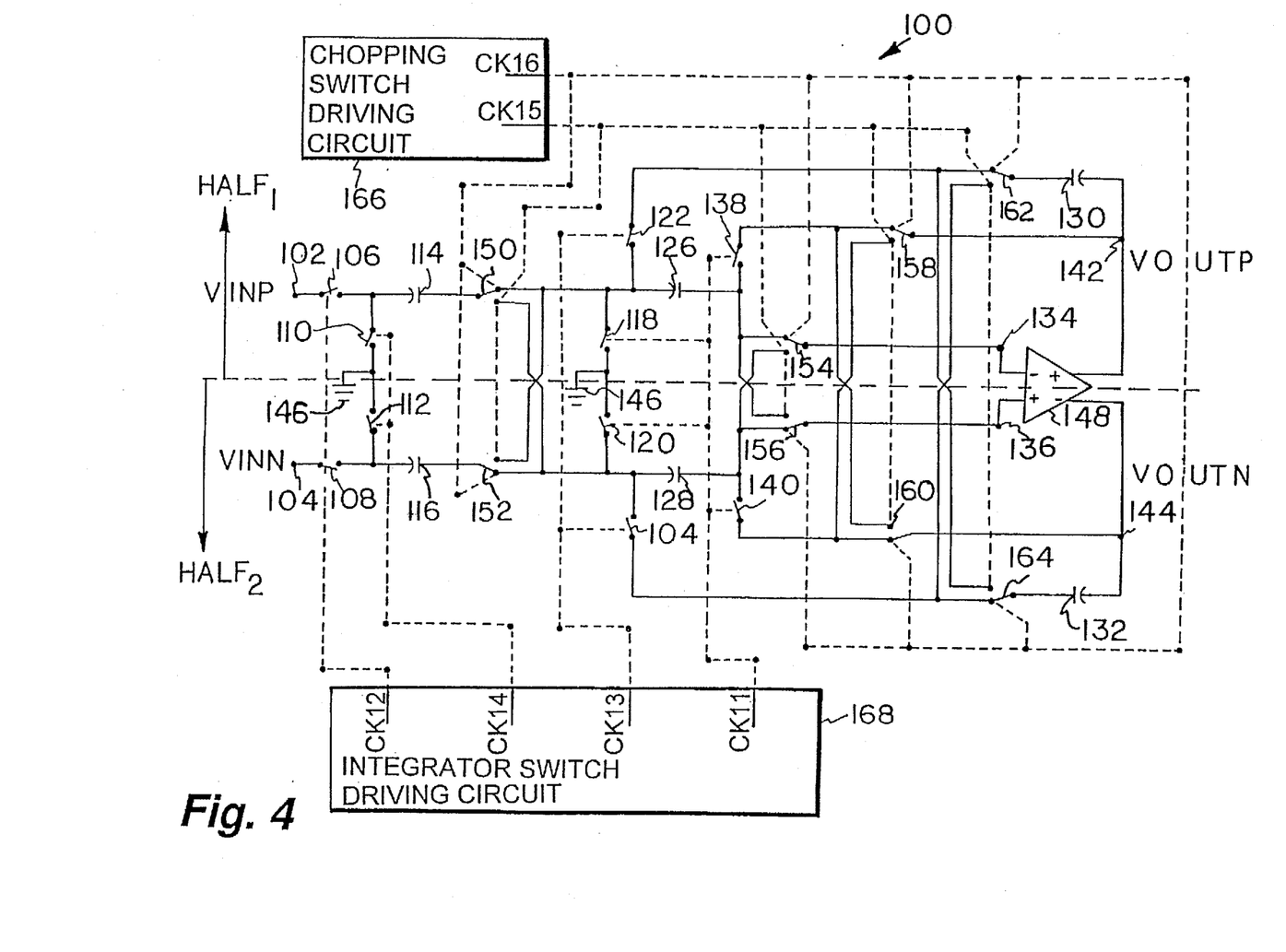
FIG. 4 is a schematic circuit diagram of a first switched-capacitor circuit according to the present invention.
Figure 5:
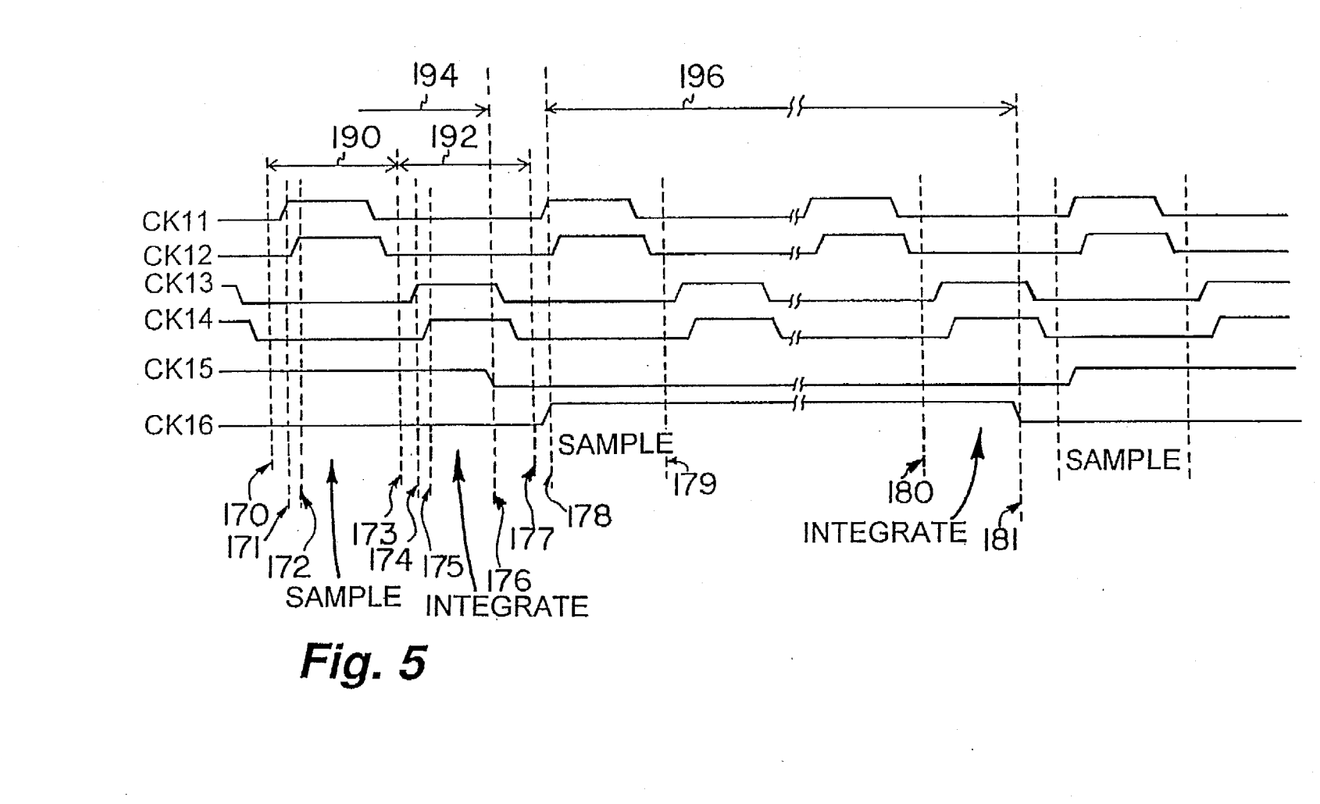
FIG. 5 is a timing diagram for representative sampling intervals and representative integrating intervals, illustrating clock signals that drive the switches in the circuit of FIG. 4.

Referring to FIG. 4 and FIG. 5, an illustrative sampling and integrating switched-capacitor circuit 100 according to the invention generally operates by sampling a differential signal during a sampling interval 190 and then integrating the sampled signal during an integrating interval 192. In addition to its sample and integrate function, this circuit includes chopping switches that minimize offset voltage effects that can result from the sample and integrate function.

More specifically, the sampling and integrating circuit 100 includes a first sampling capacitor 114 and a second sampling capacitor 116. A first plate of the first sampling capacitor is operatively connected to a second terminal of a first input switch 106 and to a first terminal of a first input grounding switch 110. A first terminal of the first input switch is operatively connected to a first input terminal 102, and a second terminal of the first input grounding switch is operatively connected to a ground node 146. Similarly, a first plate of the second sampling capacitor is operatively connected to a second terminal of a second input switch 108 and a first terminal of a second input grounding switch 112. A first terminal of the second input switch is operatively connected to a second input terminal 104, and a second terminal of the second input grounding switch is operatively connected to the ground node.

A second plate of the first sampling capacitor 114 is operatively connected to an input of a first sample chopping switch 150. This chopping switch includes two outputs that can operatively connect this second plate to one of either a first terminal of a first integrate switch 122 or a first terminal of a second integrate switch 124. Likewise, a second plate of the second sampling capacitor 116 is operatively connected to an input of a second sample chopping switch 152. This chopping switch includes two outputs that can operatively connect this second plate to the first terminal of one of the integrate switches 122 and 124.

The sampling and integrating circuit 100 also includes a first integrating capacitor 130 and a second integrating capacitor 132. A first plate of the first integrating capacitor 130 and a first plate of the second integrating capacitor 132 are operatively connected to respectively a first output terminal 142 and a second output terminal 144 of an amplifier 148.

A second plate of the first integrating capacitor 130 is operatively connected to an output terminal of a first integrate chopping switch 162. This chopping switch has two input terminals that can operatively connect this second plate to one of either a second terminal of the first integrate switch 122 or a second terminal of the second integrate switch 124. Similarly, a second plate of the second integrating capacitor 132 is operatively connected to an output terminal of a second integrate chopping switch 164. This chopping switch has two input terminals that can operatively connect this second plate to the second terminal of one of the integrate switches 122 and 124.

The sampling and integrating circuit 100 also includes a first offset cancelling capacitor 126 and a second offset cancelling capacitor 128. A first plate of the first offset cancelling capacitor is operatively connected to the first terminal of the first integrate switch 122, and to the ground node 146 via a first cancelling grounding switch 118. Likewise, a first plate of the second offset cancelling capacitor is operatively connected to the first terminal of the second integrate switch 124 and the ground node via a second cancelling grounding switch 120.

A second plate of the first offset capacitor 126 is operatively connected to a first terminal of a first offset switch 138, and to one of two input terminals of a first offset chopping switch 154 and to one of two input terminals of a second offset chopping switch 156. Similarly, a second plate of the second offset capacitor 128 is operatively connected to a first terminal of a second offset switch 140, and the other one of the two input terminals of the first and second offset chopping switches. The output of the first offset chopping switch is operatively connected to a first amplifier input 134, and the output of the second offset chopping switch is operatively connected to a second amplifier input 136.

The first amplifier output 142 is operatively connected to an input of a first feedback chopping switch 158. Similarly, the second amplifier output 144 is operatively connected to an input of a second feedback chopping switch 160. The first feedback chopping switch has two outputs that can operatively connect the first amplifier output to a second terminal of one of either the first offset switch 138 or the second offset switch 140. Likewise, the second amplifier feedback chopping switch has two outputs that can operatively connect the second amplifier output to the second terminal of the other one of the offset switches.

The sampling and integrating circuit 100 also includes an integrator switch driving circuit 168. This driving circuit controls the switches that perform the sample and integrate function. Each of these switches are comprised of a first terminals a second terminal, and a control input. When a control signal on the control input at such a switch is high, the switch closes to create a short circuit between its first terminal and its second terminal. Conversely, when the control signal on the control input is low, the switch opens to create an open circuit between the first terminal and the second terminal.

A first terminal CK12 of the integrator switch driving circuit 168 is operatively connected to a control input of the first input switch 106 and a control input of the second input switch 108. A second terminal CK14 of the integrator switch driving circuit is operatively connected to a control input of the first input grounding switch 110 and a control input of the second input grounding switch 112.

A third terminal CK13 of the integrator switch driving circuit 168 is operatively connected to a control input of the first integrate switch 122 and a control input of the second integrate switch 124. And finally, a fourth terminal CK11 of the integrator switch driving circuit is operatively connected to a control input of the first cancelling grounding switch 118, a control input of the second cancelling grounding switch 120, a control input of the first offset switch 138, and a control input of the second offset switch 140. In FIG. 4, the dashed lines from the terminals of the integrator switch driving circuit to the switches show these operative connections.

The sampling and integrating circuit 100 also includes a chopping switch driving circuit 166. This driving circuit controls the chopping switches. Each of the chopping switches are comprised of a common input or output terminal, two selectable input or output terminals, a first control input, and a second control input. Although these chopping switches are illustrated using generic switch symbols, they can be implemented using semiconductor elements such as CMOS field effect transistors on an integrated circuit.

When a first control signal on the first control input of such a chopping switch is high and a second control signal on its second control input is low, the chopping switch creates a short circuit between only its common terminal and its first selectable terminal. Conversely, when the first control signal is low and the second control signal is high, the chopping switch creates a short circuit between only its common terminal and its second selectable terminal. When the first control signal and the second control signal are both low, the chopping switch creates an open between its common terminal and both its first and second selectable terminal.

Each chopping switch acts effectively as a multiplexer or a demultiplexer with the control inputs selecting between the operative connection of the input of the chopping switch to either one of its first output or its second output. A chopping switch acts as a multiplexer when the signal in the sampling and integrating circuit 100 traverses the chopping switch from a common input terminal to one of two selectable output terminals. Conversely, a chopping switch acts as a demultiplexer when the signal in the sampling and integrating circuit traverses the chopping switch from one of its two selectable input terminals to its common output terminal. In addition, a state of no connection is possible in these multiplexers or demultiplexers.

A first terminal CK15 of the chopping switch driving circuit 166 is operatively connected to the first control input of all of the chopping switches in the sampling and integrating circuit 100. A second terminal CK16 of the chopping switch driving circuit is operatively connected to the second control input of all of the chopping switches. The dotted lines in FIG. 4 show these operative connections.

The chopping switches include the first sample chopping switch 150, the second sample chopping switch 152, the first integrate chopping switch 162, and the second integrate chopping switch 164 in the main signal path of the sampling and integrating circuit. The chopping switch driving circuit 166 also controls the first offset chopping switch 154, the second offset chopping switch 156, the first feedback chopping switch 158, and the second feedback chopping switch 160.

The operation of the sampling and integrating switched-capacitor circuit 100 of FIG. 4 will now be described. This circuit generally performs a sample and integrate function while alternating between a first chop state and a second chop state.

Figure 6:
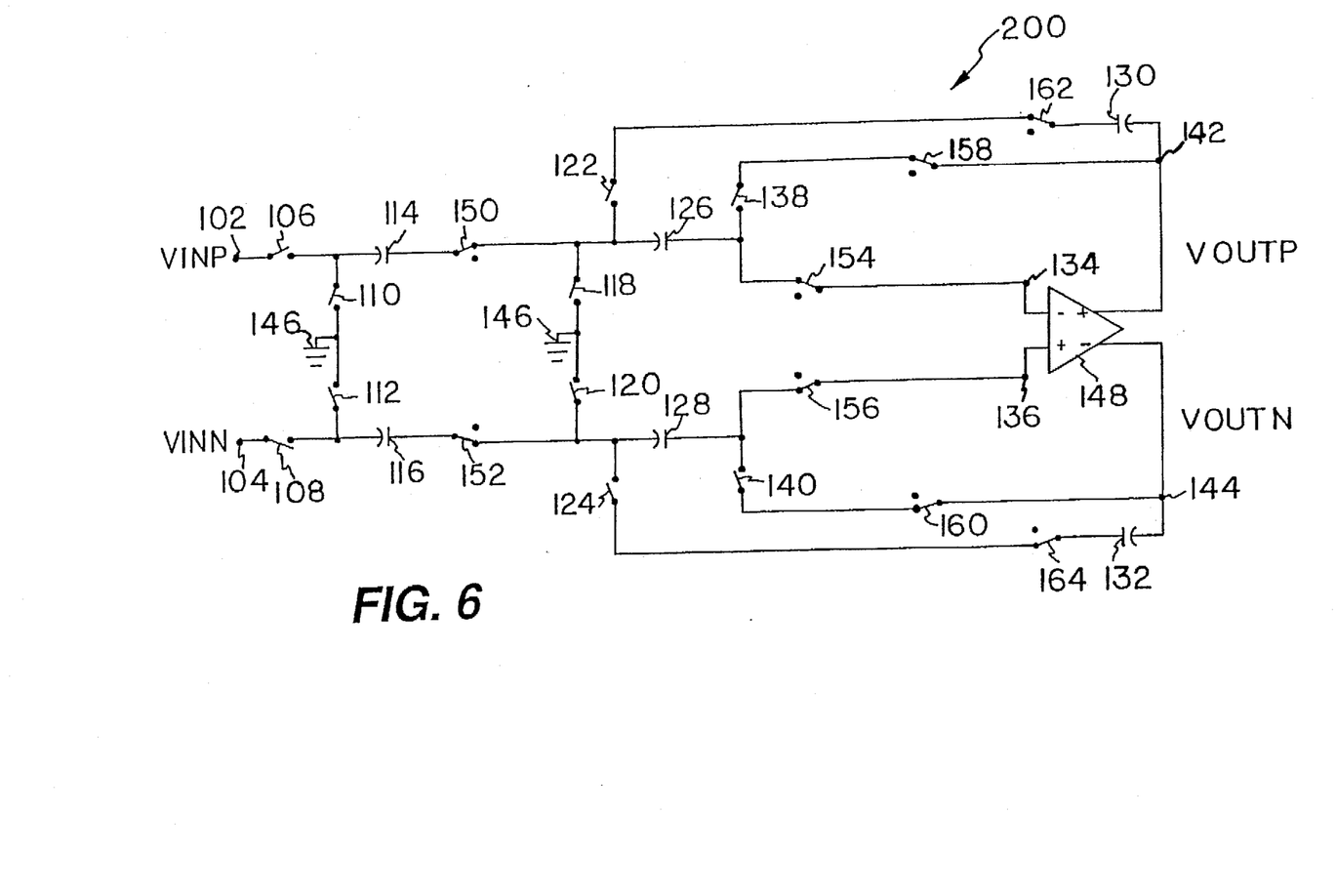
FIG. 6 is a simplified schematic circuit diagram of the circuit of FIG. 4 illustrating the active signal path when the chopping switches are in a first chop state.

Referring to FIGS. 4–6, at the start of a sampling interval 190 (time point 170), the chopping switch driving circuit 166 has driven the signal at terminal CK15 high and the signal at terminal CK16 low. With these signal states at the terminals CK15 and CK16, the sampling and integrating circuit 100 is in a first chop state. In this chop state, the chopping switches are configured as shown in the simplified first chop state equivalent circuit 200 (see FIG. 6). The circuit elements of this equivalent circuit that have the same numbered labels as the circuit elements of the sampling and integrating circuit 100 are similar elements.

While the sampling and integrating circuit 100 is in the first chop state, the circuit performs the sample function. The integrator switch driving circuit 168 begins by driving the signal on terminal CK11 high (time point 171), and this causes the first cancelling grounding switch 118 and the second cancelling grounding switch 120 to close. These closed switches operatively connect one terminal of each of the first sampling capacitor 114, the second sampling capacitor 116, the first offset cancelling capacitor 126, and the second offset cancelling capacitor 128, to the ground node 146.

At the same time, the first offset switch 138 closes and operatively connects the first amplifier output 142 to the first amplifier input 134 and to the first offset cancelling capacitor 126. Similarly, the second offset switch 140 closes and operatively connects the second amplifier output 144 to the second amplifier input 136 and to the second offset cancelling capacitor 128. As a result of these operative connections, the first and second offset cancelling capacitors charge up to the offset voltage at respectively the first and second amplifier inputs.

The integrator switch driving circuit 168 then drives the signal on terminal CK12 high (time point 172). This causes the first input switch 106 to close and to operatively connect the first input 102 to the first sampling capacitor 114, and the second input switch 108 to close and to operatively connect the second input 104 to the second sampling capacitor 116. These operative connections cause the first and second sampling capacitors to sample the respective signals VINP and VINN at the first and second inputs respectively.

The integrator switch driving circuit 168 then successively drives the signal on terminals CK11 and CK12 low at the end of the sampling phase 190 (time point 173). At this point in time, the switches that were closed while the signals on terminals CK11 and CK12 were high are open.

The signal on terminal CK12 is slightly delayed from the signal on terminal CK11. As a result, the first cancelling grounding switch 118, the second cancelling grounding switch 120, the first offset switch 138, and the second offset switch 140 open before the first input switch 106 and the second input switch 108. Consequently, the charge injections from the opening of the first and second input switches do not accumulate on a circuit node since the first and second cancelling grounding switches, and the first and second offset switches are already opened to break the circuit path from the first and second input switches to the ground node 146. The first and second cancel grounding switches, and the first and second offset switches are called quick switches and form quick switch pairs, and the first and second input switches are called non-quick switches.

At the end of the sampling interval 190, the sampling and integrating circuit 100 is still in the first chop state and enters an integrating interval 192. After the beginning of this interval, the integrating switch driving circuit 168 drives the signal at terminal CK13 high (time point 174). Consequently, the first integrate switch 122 closes to operatively connect the first integrating capacitor 130 to the first sampling capacitor 114. Similarly at this time point, the second integrate switch 124 closes to operatively connect the second integrating capacitor 132 to the second sampling capacitor 116. These operative connections cause the charge that was stored on the first and second sampling capacitors during the sampling interval to transfer to respectively the first and second integrating capacitors. Thus, the integrating capacitors integrate the signals that were at the first input terminal 102 and the second input terminal 104 during the last sampling interval 190.

Shortly thereafter, the integrator switch driving circuit 168 drives the signal at terminal CK14 high (time point 175). Consequently, the first input grounding switch 110 closes to operatively connect the first sampling capacitor 114 to the ground node 146. The second input grounding switch 112 also closes to operatively connect the second sampling capacitor 116 to the ground node. These operative connections cause the first offset cancelling capacitor 126 and the second offset cancelling capacitor 128 to operatively connect in series with each other between the first amplifier input 134 and the second amplifier input 136. Thus, the charge that was stored in the first offset cancelling capacitor 126 and the charge that was stored in the second offset cancelling capacitor 128 during the preceding sampling interval 190 together cancel out the input offset from the amplifier 148.

The integrator switch driving circuit 168 then drives the signals on terminals CK13 and CK14 low at the end of the integrating interval 192 (time point 177). At this point in time, the switches that were closed while the signals on terminals CK13 and CK14 were high, are now open.

The signal on terminal CK14 is slightly delayed from the signal on terminal CK13. As a result, the first integrate switch 122 and the second integrate switch 124 open before the first input grounding switch 110 and the second input grounding switch 112, and the circuit paths from the first and second input grounding switches to the ground node 146 are open. Consequently, the charge injection from the opening of the first and second input grounding switches do not accumulate. The first and second integrate switches are called quick switches and form a quick switch pair, while the first and second input grounding switches are called non-quick switches.

The chopping switch driving circuit 166 changes the signal on terminal CK15 from high to low and the signal on terminal CK16 from low to high toward the end of the integrating interval 192 (time point 178). With these new states on terminals CK15 and CK16, the sampling and integrating circuit 100 enters the second chop state. During this chop state, the chopping switches of the switched capacitor circuit 100 are configured as shown in the second chop state equivalent circuit 220 (see FIG. 7). The circuit elements in this equivalent circuit that have the same numbered label as the circuit elements in the switched capacitor circuit 100 are similar elements.

Referring to the timing diagram of FIG. 5, the sampling and integrating circuit 100 performs the sample and integrate function during the second chop state in a manner that is similar to that described for the first chop state. In addition, although the sampling and integrating circuit can alternate from the first chop state to the second chop state after each pair of sampling and integrating intervals, it instead repeats the sample and integrate function a number of times during each chop state. This can reduce offset voltage effects from the mismatch in charge injection in the chopping switches, as will be discussed below.

For proper operation of the sampling and integrating circuit 100, the high phase on terminals CK11 and CK12 should not overlap with the high phase on terminals CK13 and CK14. This can be achieved by allowing for a guard time interval between the point of time when the signal on terminal CK12 turns low to the point of time when the signal on terminal CK13 turns high.

In one embodiment, the sampling and integrating circuit 100 repeats the sampling and integrating intervals at a frequency of 2.5 MHz, while the circuit repeats the first and second chop states at a frequency that is 64 times less than 2.5 MHz. The guard time is typically 5–10 ns long, and the duration of time when the signal on one of the terminals, CK11, CK12, CK13, and CK14 remains high is therefore typically around 190–195 ns. The signal to the control input of the non-quick switches is delayed from the signal to the control input of the quick switches by about 1 ns.

The interchange of the sampling and integrating circuit 100 between the first chop state and the second chop state reduces the offset effect from mismatch in charge injection by the quick switch pairs. The quick switch pairs include the first cancelling grounding switch 118 and the second cancelling grounding switch 120, the first offset switch 138 and the second offset switch 140, and the first integrate switch 122 and the second integrate switch 124.

Figure 7:
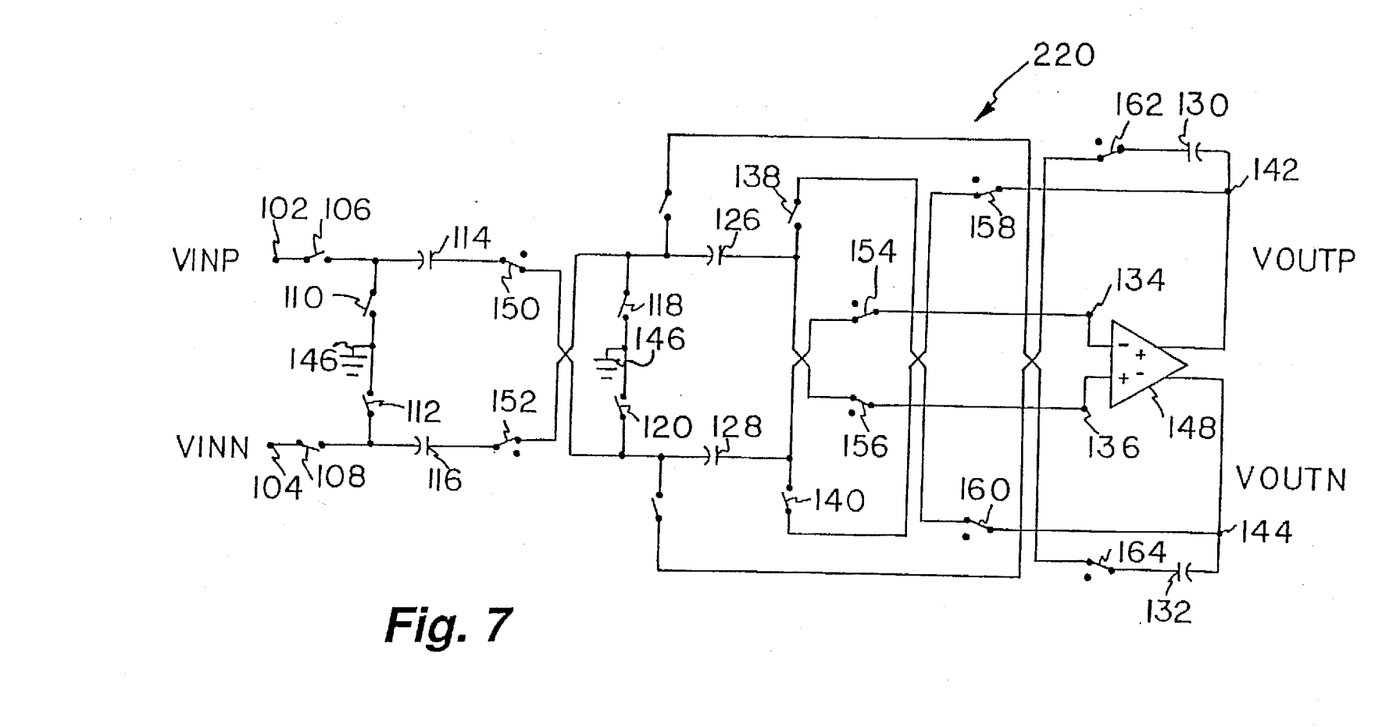
FIG. 7 is a simplified schematic circuit diagram of the circuit of FIG. 4 illustrating the active signal path when the chopping switches are in a second chop state.

The distinction between the chopping switch configurations during the first chop state and the second chop state is that each switch in a quick switch pair is exchanged between serving in the two halves, half$_1$ and half$_2$, of the sampling and integrating circuit 100. Thus, during the first chop state, the first cancelling grounding switch 118, the first offset switch 138, and the first integrate switch 122 are in the first signal path in half$_1$, while the second cancelling grounding switch 120, the second offset switch 140, and the second integrate switch 124 are in the second signal path in half$_2$.

Then during the second chop state, the signal path of each switch of each quick switch pair exchanges with the signal path of the complementary switch within each pair. Thus during the second chop state, the second cancelling grounding switch 120, the second offset switch 140, and the second integrate switch 124 are in the first signal path in half$_1$ while the first cancelling grounding switch 118, the first offset switch 138, and the first integrate switch 122 are in the second signal path in half$_2$.

By alternating the signal paths that each switch in the quick switch pair serves, mismatch in charge injection from these pairs can be distributed evenly between the two halves of the switched capacitor circuit. By having each switch within the quick switch pair serve equal times in the two halves of a fully differential circuit and repeating the cycle of the first chop state and the second chop state, the differential offset due to mismatch in the switch charge injection from the quick switch pairs can be substantially cancelled over time.

Thus, a circuit according to the present invention can reduce the offset voltage effects from the mismatch in switch charge injection from the quick switches, which can be the major charge injection contributors. The present invention can also reduce the temperature drift of this offset voltage that can occur due to temperature dependency of the switch charge injection. Moreover, because the quick switch pairs are chopped, instead of the amplifier, the present invention can avoid mixing high frequency noise into the baseband of the amplifier. It can achieve this advantage without requiring a chopping frequency above the sampling rate, so power consumption can be kept low.

To reduce offset voltage effects from mismatch in charge injection from the chopping switches, the chopping rate can be many times lower than the sampling and integrating rate, as mentioned above. The chopping rate is the frequency at which the circuit repeats the first and second chop states. The sampling and integrating rate is the frequency at which the circuit repeats the sampling and integrating intervals.

A switch contributes charge injection during a short toggling period that takes place while the driving signal of that switch makes a transition from a high to a low state, or from a low to a high state. The chopping rate determines the rate of occurrence of this toggling period by the chopping switches, and the sampling and integrating rate determines the rate of occurrence of this toggling period by the switches that perform the sample and integrate function.

If the chopping rate is lower than the sampling and integrating rate, then the chopping switches will toggle less and contribute less charge injection. In one embodiment, for example, the chopping rate can be 64 times less than the sampling and integrating rate. Thus, the chopping switches can contribute substantially less charge injection than the switches that perform the sample and integrate function.

The charge injection from the first sample chopping switches 150, 152 can further be minimized. In particular, since the signals on terminals CK15 and CK16 make transitions just before the transition of the signal on terminal CK11, the first cancelling grounding switch 118 and the second cancelling grounding switch 120 close shortly after the first and second sample chopping switches (time point 178). As a result, charge injections when these chopping switches toggle are harmlessly sent to the ground node 146 via the grounding switches.

Furthermore, charge injections from the first offset chopping switch 154, the second offset chopping switch 156, the first feedback chopping switch 158, and the second feedback chopping switch 160 are absorbed by the offset cancelling capacitors. This is because, during the sampling interval, the first offset chopping switch and the first feedback chopping switch are operatively connected to the first offset cancelling capacitor 126, and the second offset chopping switch and the second feedback chopping switch are operatively connected to the second offset cancelling capacitor 128. In this configuration, the amplifier 148 drives the voltage on the first offset cancelling capacitor 126 and the second offset cancelling capacitor 128 to the amplifier input offset regardless of the charge injection from these chopping switches. Since these chopping switches are in the feedback path of the amplifier, the first and second offset cancelling capacitors absorb their charge injections as they charge up to the amplifier input offset.

Among all of the chopping switches, therefore, only the first integrate chopping switch 162 and the second integrate chopping switch 164 may contribute any lasting offset effect to the sampling and integrating circuit 100 of FIG. 4. The first integrating capacitor 130 traps the charge injection from the first integrate chopping switch 162, and the second integrating capacitor 132 traps the charge injection from the second integrate chopping switch 164. These charge injections are indistinguishable from the signal charge and contribute to offset error.

For design predictability, the first integrate chopping switch 162 and the second integrate chopping switch 164 should open before the first integrate switch 122 and the second integrate switch 124. In the timing diagram of FIG. 5, the signals on terminals CK15 and CK16 that drive the first and second integrate chopping switches make a high to low transition before the signal on terminal CK13 that drives the first and second integrate switches makes a high to low transition (time point 181). The timing of these signals is important for design predictability because the amount of charge injected by a switch is strongly modulated by the voltage on the switch at the time of toggle. Having the first and second integrate switches closed when the first and second integrate chopping switches open fixes the voltage at these chopping switches as they toggle.

Figure 8:
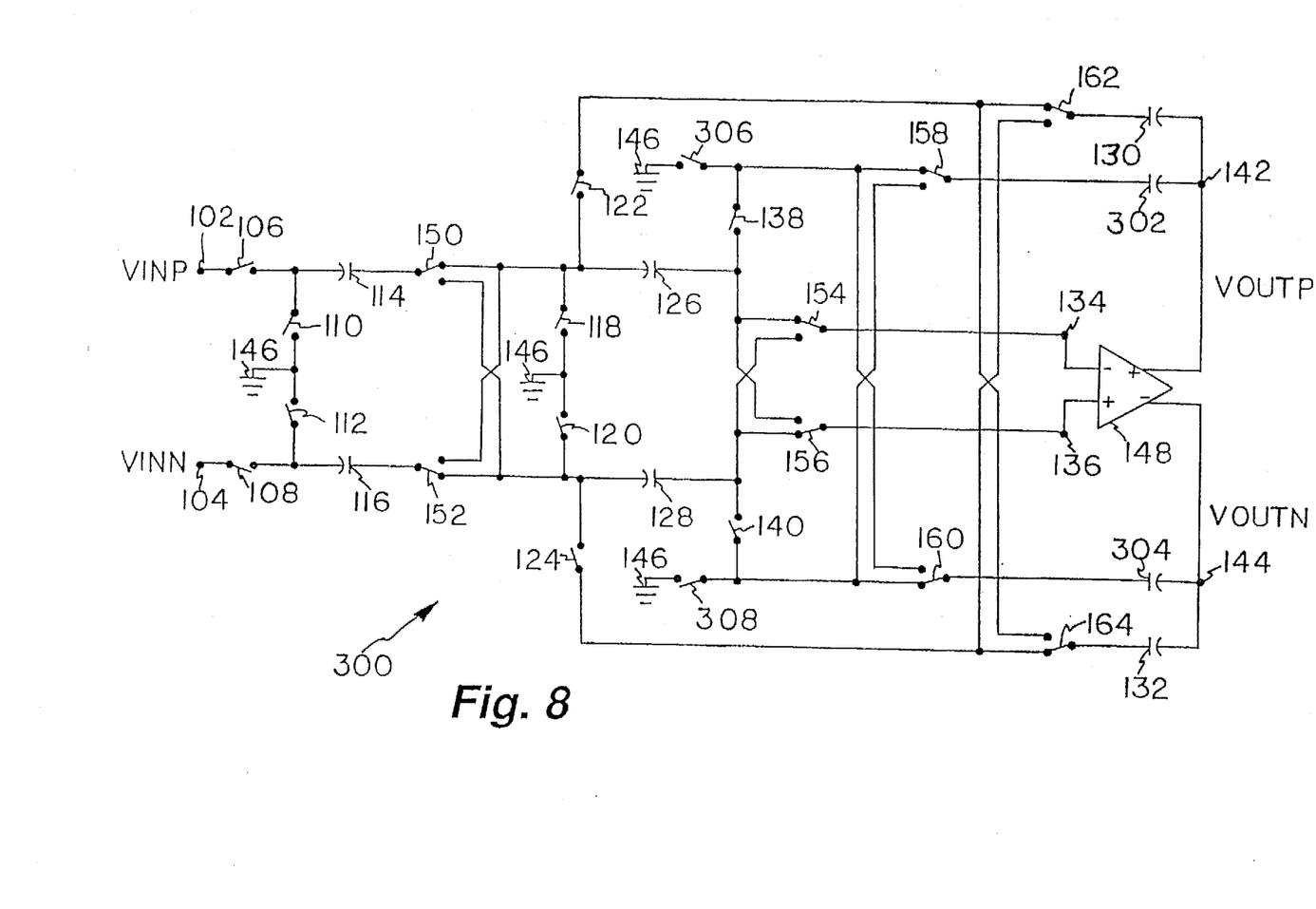
FIG. 8 is a schematic circuit diagram of a second switched-capacitor circuit according to the present invention, which consumes less power than the circuit of FIG. 4.

Referring to FIG. 8, an alternative sampling and integrating circuit 300 according to the present invention differs from the circuit 100 of FIG. 4 in that it also includes a first output maintenance capacitor 302 and a second output maintenance capacitor 304. The first output maintenance capacitor is within the operative connection of the first output 142 and the input terminal of the first feedback chopping switch 158. Similarly, the second output maintenance capacitor is within the operative connection between the second output 144 and the input terminal of the second feedback chopping switch 160.

The alternative sampling and integrating circuit 300 also additionally includes a first output maintenance grounding switch 306 and a second output maintenance grounding switch 308. The first output maintenance grounding switch 306 is operatively connected between the second terminal of the first offset switch 138 and a reference voltage such as the ground node 146, and the second output maintenance grounding switch 308 is operatively connected between the second terminal of the second offset switch 140 and a reference voltage such as the ground node.

The alternative sampling and integrating circuit 300 performs sample and integrate functions in a manner similar to that performed by the sampling and integrating circuit 100 of FIG. 4. However, during the sampling interval, the first output maintenance capacitor 302 and the second output maintenance capacitor 304 respectively maintain the first output 142 and the second output 144 at a voltage that was reached at the end of the last integrating interval. This avoids the requirement on the amplifier outputs to return to their offset voltage between successive integrating intervals. The elimination of this requirement results in reduced output swing of the amplifier and thereby can lower power consumption. In addition, the first integrator switch 122 and the second integrator switch 124 open and close at approximately the same voltage. This prevents a signal-dependent charge injection error in these switches.

More particularly, referring to FIGS. 5 and 8, the signal on terminal CK14 drives the first output maintenance grounding switch 138 and the second output maintenance grounding switch 140. During the integrating interval 192, therefore, these switches close to operatively connect respectively the first and second output maintenance capacitors 302, 304 between respectively the first and second outputs 142, 144, and the ground node 146. Thus, during this integrating interval, the first and second output maintenance capacitors respectively charge up to the voltage at the first and second outputs.

Then, during the following sampling interval, the integrator switch driving circuit 168 in FIG. 4 drives the signal on terminal CK14 low. As a result, the first and second output maintenance grounding switches 306 and 308 open, while the first and second offset switches 138 and 140 close. When the offset switches are closed, they operatively connect the first and second output maintenance capacitors 302, 304, to the first and second offset cancelling capacitors 126, 128 respectively.

These connections cause the first and second output maintenance capacitors 302, 304 to provide the charge needed to charge the offset cancelling capacitors 126, 128, until the amplifier input offset is stored on the first and second offset cancelling capacitors. Even after this charging, however, a substantial amount of charge remains stored on the first and second output maintenance capacitors. As a result, when the next sampling and integrating circuit 300 enters the integrating interval the first and second outputs 142 and 144 may need to make only incremental transitions from the last integrating interval. Keeping changes at the first and second outputs small in this way reduces power consumption of the alternative circuit 300.

Figure 9:
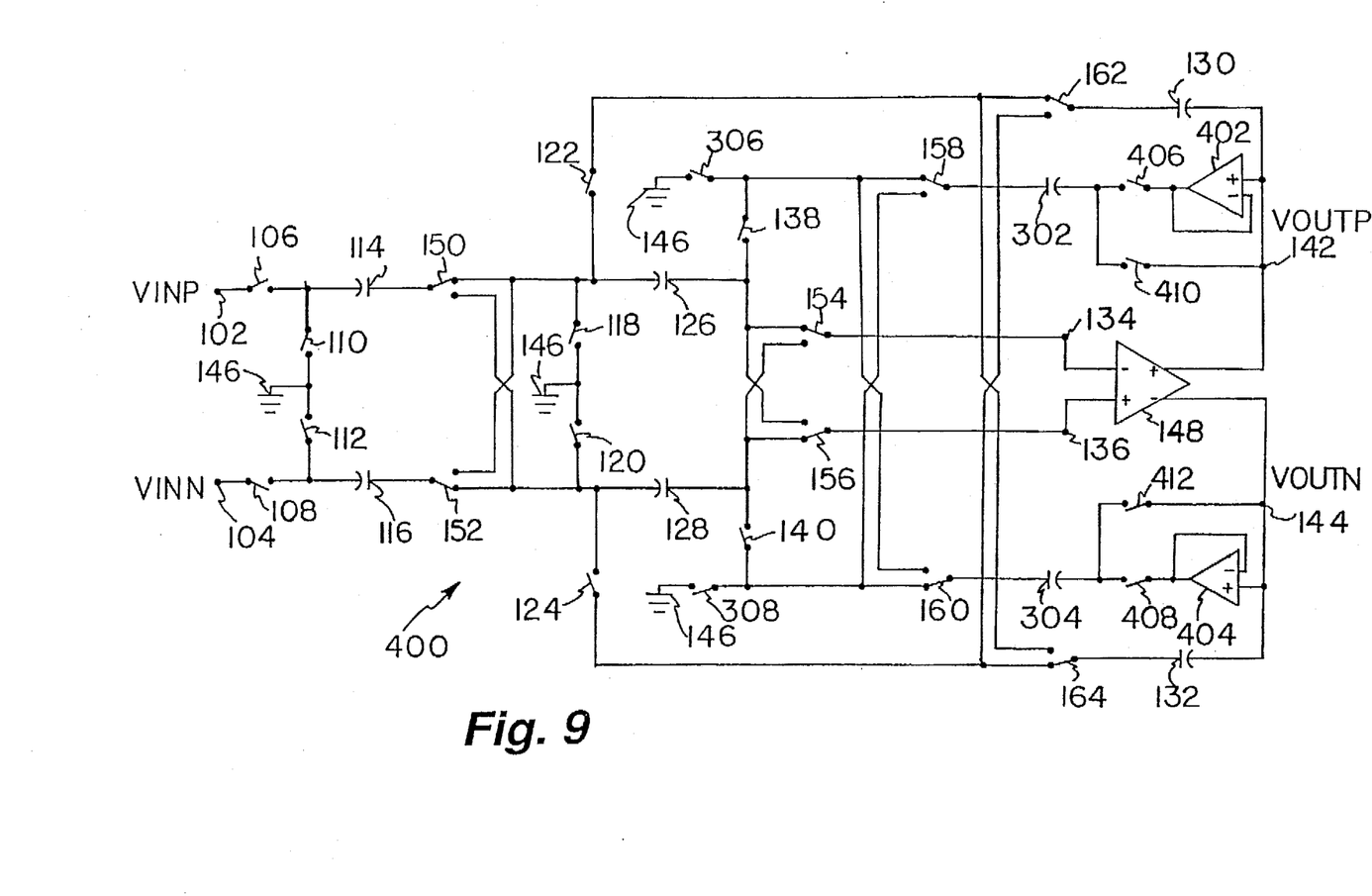
FIG. 9 is a schematic circuit diagram of a third switched-capacitor circuit according to the present invention, which has lower capacitive loading of the amplifier than the circuit of FIG. 8.

Referring to FIG. 9, a second alternative sampling and integrating circuit 400 according to the present invention differs from the alternative circuit 300 of FIG. 8 in that it also includes the following additional elements: a first output buffer 402, a second output buffer 404, a first buffer integrate switch 406, a second buffer integrate switch 408, a first buffer sample switch 410, and a second buffer sample switch 412. The first output buffer 402 and the first buffer integrate switch 406 are within the operative connection of the first output 142 and a second plate of the first output maintenance capacitor 302. The first output buffer is operatively connected between the first output and a second terminal of the first buffer integrate switch. A first terminal of the first buffer integrate switch is operatively connected to the second plate of the first output maintenance capacitor. Likewise, the second output buffer 404 and the second buffer integrate switch 408 are within the operative connection of the second output 144 and a second plate of the second output maintenance capacitor 304. The second output buffer is operatively connected between the second output and a second terminal of the second buffer integrate switch. A first terminal of the second buffer integrate switch is operatively connected to the second plate of the second output maintenance capacitor.

The first sample buffer switch 410 is operatively connected between the first output 142 and the second plate of the first output maintenance capacitor. Similarly, the second sample buffer switch 412 is operatively connected between the second output 144 and the second plate of the second output maintenance capacitor.

Referring to FIG. 5 and FIGS. 8-9, the second alternative circuit 400 also performs the sample and integrate functions in a manner that is similar to that performed by the alternative sampling and integrating circuit 300. Specifically, the first and second output maintenance capacitors 302 and 304 maintain the first and second outputs 142, 144 at the respective voltages that they reached at the end of the integrating interval. In addition, however, the alternative circuit 400 has a significantly lower capacitive load at the first and second outputs during the integrating interval than that of the sampling and integrating circuit 300, because the first and second output buffers 402 and 404 drive respectively the first and second output maintenance capacitors 302 and 304 during the integrating interval.

More particularly, during the integrating interval 192, the first and second output maintenance capacitors 302, 304 are operatively connected between respectively the first and second outputs 142, 144 and the ground node 146. The first and second buffer integrate switches 406, 408 close, while the first and second buffer sample switches 410,412 are open. This causes the first and second output buffers 402, 404 to intervene between respectively the first and second outputs 142, 144 and the first and second output maintenance capacitors 302, 304. The intervention of these buffers can eliminate the capacitive loading of the first and second output maintenance capacitors at the first and second outputs. Because full settling of output maintenance capacitors 302 and 304 is not required during the integrating interval, the first and second output buffers can be small in area and can consume little power.

During the sampling interval subsequent to this integrating interval, the first and second buffer integrate switches 406, 408 open, and the first and second buffer sample switches 410, 412 close. This causes the first and second outputs 142, 144 to be operatively connected to respectively the first and second output maintenance capacitors 302, 304 without the intervention of respectively the first and second output buffers 402, 404. As a result, the first and second output maintenance capacitors 302, 304 are in direct feedback from the first and second outputs 142, 144 to respectively the first and second offset cancelling capacitors 126, 128, and the amplifier 148 can drive the circuit to full settling during this sampling interval. Since the output maintenance capacitors are typically large relative to the offset cancelling capacitors, the feedback loop gain is maintained in this configuration. Any increase in power attributable to the use of the first and second buffers 402, 404 can be offset by power savings from reducing capacitive loading on the amplifier 148.

Having thus described various embodiments of the present invention, additional alterations, modifications and improvements will readily occur to those skilled in the art. Accordingly, the foregoing description is by way of example only, and is not intended to be limiting. The invention is limited only as defined in the following claims and the equivalents thereto.

What is claimed is:

1. A switched-capacitor circuit comprising:

a first input node;

a second input node;

a first output node;

a second output node;

a first switch that includes a first switch control input, a first switch input, and a first switch output, with a first circuit path being provided between the first switch output and the first output node;

a second switch that includes a second switch control input, a second switch input, and a second switch output, with a second circuit path being provided between the second switch output and the second output node;

a first demultiplexer that includes a first demultiplexer input, a first demultiplexer output, a second demultiplexer output, and a first demultiplexer control input, the first demultiplexer input being operatively connected to the first input node, the first demultiplexer output being operatively connected to the first switch input, and the second demultiplexer output being operatively connected to the second switch input; and a second demultiplexer that includes a second demultiplexer input, a third demultiplexer output, a fourth demultiplexer output, and a second demultiplexer control input, the second demultiplexer input being operatively connected to the second input node, the third demultiplexer output being operatively connected to the second switch input, and the fourth demultiplexer output being operatively connected to the first switch input.

2. The switched-capacitor circuit according to claim 1, further comprising:

a first multiplexer, being disposed within the first circuit path, which first multiplexer includes a first multiplexer input, a second multiplexer input, a first multiplexer output, and a first multiplexer control input, the first multiplexer input being operatively connected to the first switch output, the second multiplexer input being operatively connected to the second switch output, and the first multiplexer output being operatively connected to the first output node; and a second multiplexer, being disposed within the second circuit path, which second multiplexer includes a third multiplexer input, a fourth multiplexer input, a second multiplexer output, and a second multiplexer control input, the third multiplexer input being operatively connected to the second switch output, the fourth multiplexer input being operatively connected to the first switch output, and the second multiplexer output being operatively connected to the second output node.

3. The switched-capacitor circuit according to claim 2, further comprising:

a first control driving circuit having a first control terminal operatively connected to the first switch control input and the second switch control input; and a second control driving circuit having a second control terminal operatively connected to the first and second demultiplexer control inputs, and a third control terminal operatively connected to the first and second multiplexer control inputs.

4. The switched-capacitor circuit according to claim 3, wherein:

the switched-capacitor circuit is a sampling and integrating circuit;

the first switch is a first integrate switch; and the second switch is a second integrate switch; and the switched-capacitor circuit further comprising:

a first sampling capacitor operatively connected to the first input node;

a second sampling capacitor operatively connected to the second input node;

an amplifier having a first amplifier input, a second amplifier input, a first amplifier output, and a second amplifier output;

a third multiplexer having a first input, a second input, an output, and a control input, with a third circuit path being provided between the first input of the third multiplexer and the first switch input and with a fourth circuit path being provided between the second input of the third multiplexer and the second switch input, the output of the third multiplexer being operatively connected to the first amplifier input, and the control input of the third multiplexer being operatively connected to the third control terminal;

a fourth multiplexer having a first input, a second input, an output, and a control input, with a fifth circuit path being provided between the first input of the fourth multiplexer and the second switch input and with a sixth circuit path being provided between the second input of the fourth multiplexer and the first switch input, the output of the fourth multiplexer being operatively connected to the second amplifier input, and the control input of the fourth multiplexer being operatively connected to the third control terminal;

a first integrating capacitor operatively connected between the first multiplexer output and the first amplifier output; and a second integrating capacitor operatively connected between the second multiplexer output and the second amplifier output.

5. The switched-capacitor circuit according to claim 4, further comprising:

a first amplifier offset cancelling capacitor being disposed within the third circuit path; and a second amplifier offset cancelling capacitor being disposed within the fourth circuit path.

6. The switched-capacitor circuit according to claim 4, further comprising:

a first output maintenance capacitor having a first plate and a second plate, with a fifth circuit path being provided between the first plate and the first amplifier output, and the second plate being operatively connected to a first reference voltage; and a second output maintenance capacitor having a third plate and a fourth plate, with a sixth circuit path being provided between the third plate and the second amplifier output, and the fourth plate being operatively connected to a second reference voltage.

7. The switched-capacitor circuit according to claim 6, further comprising:

a first output maintenance grounding switch operatively connected to the third plate; and a second output maintenance grounding switch operatively connected to the fourth plate.

8. The switched-capacitor circuit according to claim 6, further comprising:

a first buffer being disposed within the fifth circuit path; and a second buffer being disposed within the sixth circuit path.

9. A switched-capacitor circuit comprising:

a first input node;

a second input node;

a first output node;

a second output node;

a first signal path being disposed in a first circuit path between the first input node and the first output node;

a second signal path being disposed in a second circuit path between the second input node and the second output node;

a first switch having an input and an output;

a second switch having an input and an output; and a means for alternately disposing both the input and output of the first switch within the first and second signal paths and both the input and output of the second switch within the first and second signal paths.

10. The switched-capacitor circuit according to claim 9, further comprising:

an amplifier having outputs and inputs, the inputs being responsive to the first and second switches, and having an amplifier input offset; and means for cancelling the amplifier input offset.

11. The switched-capacitor circuit according to claim 9, further comprising:

an amplifier having outputs, and inputs responsive to the first and second switches, and having an amplifier input offset; and output maintaining means responsive to the outputs of the amplifier.

12. The switched-capacitor circuit according to claim 11, wherein the output maintaining means comprise buffering means.

13. A method of operating a switched-capacitor circuit, comprising steps of:

A. switching with a first switch, a first signal to charge a first capacitor in a first signal path;

B. switching with a second switch, a second signal to charge a second capacitor in a second signal path;

C. switching with the second switch, the first signal to charge the first capacitor in the first signal path; and D. switching with the first switch, the second signal to charge the second capacitor in the second signal path.

14. The method according to claim 13, further including a step of repeating steps A through D a plurality of times.

15. The method according to claim 13, further including steps of repeating steps A and B a plurality of times before the steps C and D are performed, and repeating steps C and D a plurality of times after the steps C and D are performed.

16. The method according to claim 15, further including the step of maintaining an output of an amplifier in the switched capacitor circuit during one of the repeated steps A and B at substantially a voltage that was reached at an end of the steps A and B.

17. The method according to claim 16, further including steps of again repeating steps A and B a plurality of times after repeating steps C and D, and again repeating steps C and D a plurality of times after again repeating steps A and B.

18. The method according to claim 13, further including a step of storing an input offset of an amplifier in the switched-capacitor circuit in offset cancelling capacitors.

19. The method according to claim 13, further including a step of maintaining an output of an amplifier in the switched-capacitor circuit during steps C and D at substantially a voltage that was reached at an end of steps A and B.

20. The method according to claim 19, wherein the step of maintaining operates by storing charge.

21. The method according to claim 19, further including a step of buffering the output of the amplifier.

22. The method according to claim 13 wherein the steps of switching form part of a step of integrating the first and second signals.

* * * * *